(12) United States Patent
Hwang et al.

(10) Patent No.: US 6,872,421 B2
(45) Date of Patent: Mar. 29, 2005

(54) ATOMIC LAYER DEPOSITION METHOD

(75) Inventors: Chul-Ju Hwang, Sungnam-shi (KR); Kyung-Sik Shim, Sungnam-shi (KR)

(73) Assignee: Jusung Engineering Co., Ltd, Kyonggi-do (KR)

( * ) Notice: Subject to any disclaimer, the term of this patent is extended or adjusted under 35 U.S.C. 154(b) by 0 days.

(21) Appl. No.: 10/645,169

(22) Filed: Aug. 19, 2003

(65) Prior Publication Data

US 2004/0035362 A1 Feb. 26, 2004

Related U.S. Application Data

(62) Division of application No. 09/927,004, filed on Aug. 8, 2001, now Pat. No. 6,634,314.

(30) Foreign Application Priority Data

Aug. 9, 2000 (KR) ......................................... 2000-46216

(51) Int. Cl.$^7$ .............................................. C23C 16/00
(52) U.S. Cl. ................ 427/248.1; 427/255.5; 427/569
(58) Field of Search ........................... 427/248.1, 255.5, 427/569

(56) References Cited

U.S. PATENT DOCUMENTS

| | | | |
|---|---|---|---|
| 3,696,779 A | | 10/1972 | Murai et al. |
| 3,783,822 A | | 1/1974 | Wollman |
| 4,058,430 A | | 11/1977 | Suntola et al. |
| 5,062,386 A | | 11/1991 | Christensen |
| 5,281,274 A | | 1/1994 | Yoder |
| 5,302,209 A | | 4/1994 | Maeda et al. |
| 5,314,538 A | | 5/1994 | Maeda et al. |
| 5,338,362 A | | 8/1994 | Imahashi |
| 5,702,532 A | | 12/1997 | Wen et al. |
| 5,730,802 A | | 3/1998 | Ishizumi et al. |
| 5,879,459 A | * | 3/1999 | Gadgil et al. ................ 118/715 |
| 6,042,652 A | * | 3/2000 | Hyun et al. .................. 118/719 |
| 6,174,377 B1 | * | 1/2001 | Doering et al. ............. 118/729 |
| 6,391,803 B1 | * | 5/2002 | Kim et al. .................... 438/787 |
| 6,528,430 B2 | * | 3/2003 | Kwan et al. ................. 438/763 |
| 2002/0043216 A1 | | 4/2002 | Hwang et al. |
| 2003/0044533 A1 | | 3/2003 | Lee |

* cited by examiner

*Primary Examiner*—Bret Chen
(74) *Attorney, Agent, or Firm*—Timothy J Keefer; Seyfarth Shaw LLP

(57) ABSTRACT

An apparatus and method for performing atomic layer deposition. A plurality of substrates are loaded into a plurality of reaction cells. The reaction cells are disposed in a reaction chamber isolated from an exterior condition. Various paper substances are ultimately and repeatedly applied onto each substrate such that a thin film is formed on each substrate. The plurality of vapor injection pipes each inject one of the vapor substances by periodically scanning over each substrate to apply substance.

9 Claims, 3 Drawing Sheets

ATOMIC LAYER DEPOSITION METHOD

CROSS REFERENCE TO RELATED APPLICATION

This application is a Divisional of U.S. patent application Ser. No. 09/927,004 entitled "ATOMIC LAYER DEPOSITION METHOD AND SEMICONDUCTOR DEVICE FABRICATING APPARATUS HAVING ROTATABLE GAS INJECTORS", filed on Aug. 8, 2001 now U.S. Pat. No. 6,634,314 which claims the priority of Korean patent application serial No. 2000-46216, filed Aug. 9, 2000.

BACKGROUND OF THE INVENTION

1. Field of the Invention

The present invention relates to an atomic layer deposition (ALD) method and a semiconductor device fabricating apparatus having improved processing time.

2. Discussion of the Related Art

Electric devices are recently highly integrated to have smaller size including the vertical dimension. Specifically, a dielectric layer of a memory capacitor for a dynamic random access memory (DRAM) device and a gate insulating layer of a thin film transistor (TFT) device are developed to be thinner and thinner in the vertical dimension.

Under the design rule of 0.13 µm or less, new materials substitute for conventional ones to satisfy new electric qualities for devices fabricated under the same design rule. For example, instead of a heat-treated oxide film (usually, a silicon oxide film heat-treated under oxygen condition), a high dielectric film made of $Al_2O_3$, $HfO_2$, $ZrO_2$, or the like is selected for the above-mentioned gate insulating layer. For the dielectric layer of the DRAM, instead of a silicon nitride film formed by a chemical gas phase deposition, a very thin film made of a high dielectric compound such as barium-strontium-titanate (BST) or lead-zirconium-titanate (PZT) is selected.

A metal organic chemical vapor deposition (MOCVD) method was conventionally applied to fabricate the conventional thin films including silicon oxide or silicon nitride. However, because the MOCVD method is not suitable for fabricating the new thin films including BST or the like and having a thickness of about 100 Å (angstrom), new methods are developed. An atomic layer deposition (ALD) method is a typical example of the new methods.

In the MOCVD, various vapor substances are simultaneously applied to a substrate and deposited thereon to form a thin film. In the ALD method, however, various vapor substances are alternately and repeatedly applied to a substrate such that a plurality of atomic layers are sequentially deposited on the substrate to form the thin film. Recently, the ALD method is widely used to fabricate thin films of a semiconductor device.

In case of the ALD method, the thin film grows depending on a surface chemical reaction. Accordingly, though if the substrate has an irregular shape, the thin film grows uniformly on the substrate. In addition, because the thin film grows in proportion not to time but to number of cycles each sequentially providing a group of vapor substances, thickness of the thin film can be controlled precisely.

In FIG. 1, a reaction chamber 100 of an ALD apparatus according to a related art includes a lower housing 110a and an upper housing 110b, which provide a reaction zone 102 isolated from an exterior condition. Material gases are sequentially provided into the reaction zone 102 through an injection hole 140 in alternating orders. At this point, each material gas flows parallel to an upper surface of a substrate 130, which is mounted on a susceptor 120 disposed in the reaction zone 102.

A conventional method of forming aluminum oxide ($Al_2O_3$) film using the above-described reaction chamber 100 was suggested in page 3604, volume 71, Applied Physics Letters, 1997. In the reaction chamber 100 heated at a temperature of 150° C. (.degrees. C.), the substrate 130 is maintained to have a temperature of 370° C. Then, tri-methyl-aluminum $[Al(CH_3)_3]$, purge argon (Ar), water vapor, and further purge argon (Ar) are sequentially injected into the reaction zone 102 for 1, 14, 1, and 14 seconds, respectively, thereby composing a cycle. The cycle is repeated as shown in a graph of FIG. 2. A vertical axis of the graph implements a processing time. However, because the graph is conceptual, each period of the cycle is not proportional to its length.

The above-explained method according to the related art has some problems.

Because the growth of the thin film is proportional to the number of cycles, a total processing time can be shortened by shortening the time of one cycle. However, because the conventional reaction chamber adopts valves to control the flow of each vapor substance, time delays occur due to a residual response time of the valves. In another aspect, after each vapor substance fills the reaction zone and reacts with the substrate, it is exhausted out of the reaction chamber and another vapor substance is injected into the reaction zone. The above-mentioned injecting and exhausting take some time, thereby making it difficult to shorten the time of one cycle. That is to say, the growth of the thin film is very slow in the reaction chamber according to the related art, which means that productivity of the conventional ALD method is very low.

In addition, in the reaction chamber according to the related art, the deposition occurs due to just a simple contact between the substrate and the vapor substance that flows parallel to the substrate. Accordingly, a deposition rate of the vapor substance is very low, which causes a poor productivity.

Some modifications were suggested to solve the above-explained problem of low productivity.

First, if a plurality of substrates, instead of just one, are mounted in the reaction zone, a simultaneous deposition can be applied for the plurality of substrates. Second, a plurality of reaction chambers, instead of just one, may be included in the ALD apparatus for the same purpose.

In case of the first modification, the reaction chamber should be sufficiently enlarged to contain the plurality of substrates. The large reaction chamber, however, causes a slow exhaustion of the vapor substance, such that a gas phase reaction of the exhausting vapor substance may occur in the reaction chamber.

In case of the second modification, each of the plurality of reaction chambers should be connected with a vapor supply pipe that provides vapor substances. Therefore, the ALD apparatus becomes to have a complicated configuration, which causes a high cost of the ALD apparatus.

SUMMARY OF THE INVENTION

Accordingly, the present invention is directed to an ALD method and a semiconductor device fabricating apparatus, which substantially obviate one or more of the problems due to limitations and disadvantages of the related art.

An object of the present invention is to provide an improved ALD method and a semiconductor device fabricating apparatus implementing no time delay that results from valves thereof Another object of the present invention is to provide an improved ALD method and a semiconductor device fabricating apparatus implementing high deposition rate of vapor substances.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

In order to achieve the above object, the preferred embodiment of the present invention provides an atomic layer deposition method, which includes: respectively loading a plurality of substrates into a plurality of reaction cells, the plurality of reaction cells being disposed in a reaction chamber isolated from an exterior condition; alternately and repeatedly applying various vapor substances onto each substrate such that a thin film is formed 6n each substrate, wherein a plurality of vapor injection pipes each injecting one of the vapor substances periodically scans over each substrate to apply the various vapor substances alternately and repeatedly onto each substrate.

Each substrate is optionally heated using a heater disposed in the reaction chamber.

RF power is optionally applied to the vapor injection pipes such that plasma is generated in the reaction chamber.

In another aspect, the present invention provides a semiconductor device fabricating apparatus, which includes: a plurality of susceptors on which the same number of substrates are respectively mounted; a reaction chamber isolating all the substrates on the plurality of susceptors from an exterior condition; a plurality of vapor injection pipes disposed over the substrates, each vapor injection pipe relatively rotating with respect to the substrates and periodically applying a vapor substance onto each substrate; and a plurality of exhausting portion each disposed near a corresponding susceptor to exhaust a remaining vapor substance out of the reaction chamber.

A vertical distance between the susceptors and the vapor injection pipes are variable.

The apparatus optionally includes a ring-shaped heater disposed under the plurality of susceptors to heat the substrates.

The apparatus preferably further includes a partition wall separating each substrate from the others such that the vapor substance applied onto the substrate reacts with the same substrate only.

In one aspect, the plurality of susceptors are fixed and the plurality of vapor injection pipes rotate. In that case the apparatus preferably further includes a position controller controlling the rotation speed of the plurality of vapor injection pipes.

Alternatively, the plurality of vapor injection pipes are fixed and the plurality of susceptors rotate. In that case, the apparatus preferably further includes a position controller controlling the rotation speed of the plurality of susceptors.

RF power is optionally applied to the plurality of vapor injection pipes to activate the vapor substance such that plasma is generated in the reaction chamber It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
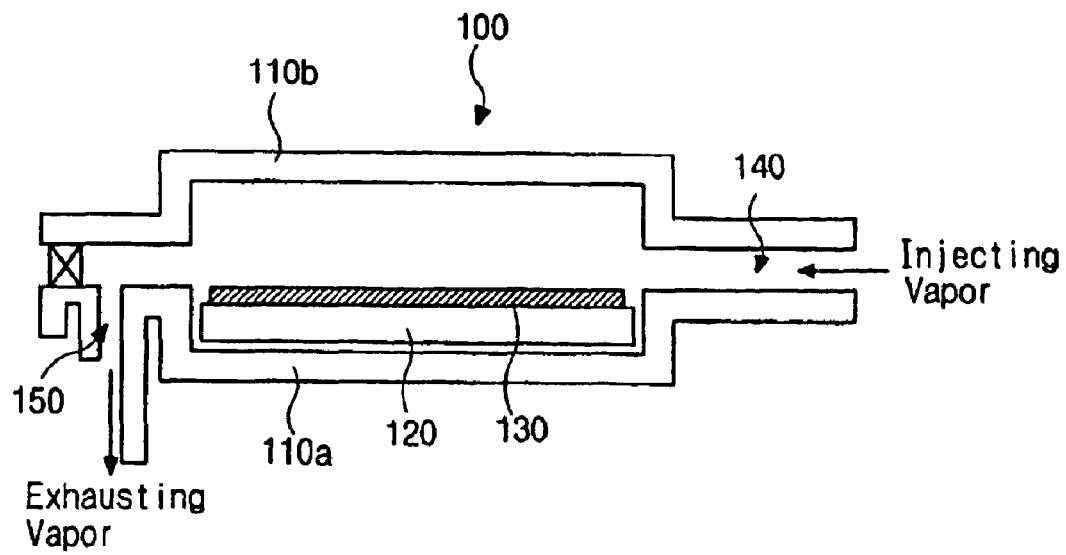
FIG. 1 is a conceptual sectional side elevation view illustrating a reaction chamber of an ALD apparatus according to the related art.
Figure 2:
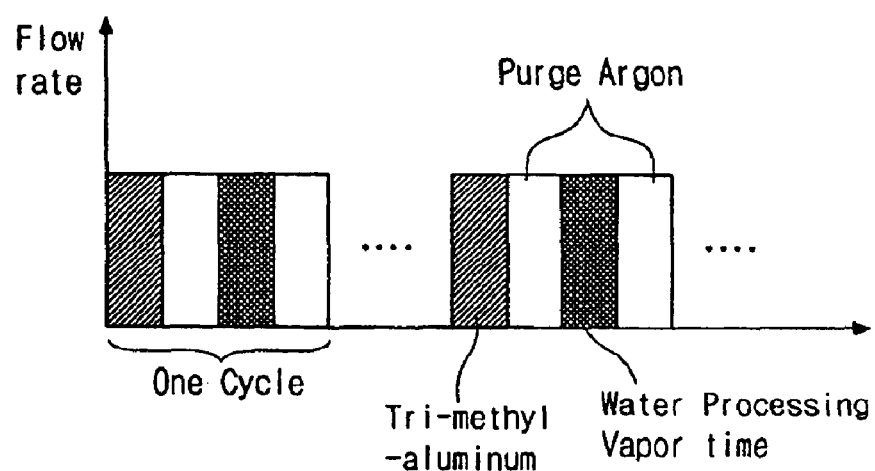
FIG. 2 is a graph illustrating repeated cycles of providing vapor substances for the ALD apparatus according to the related art.
Figure 3:
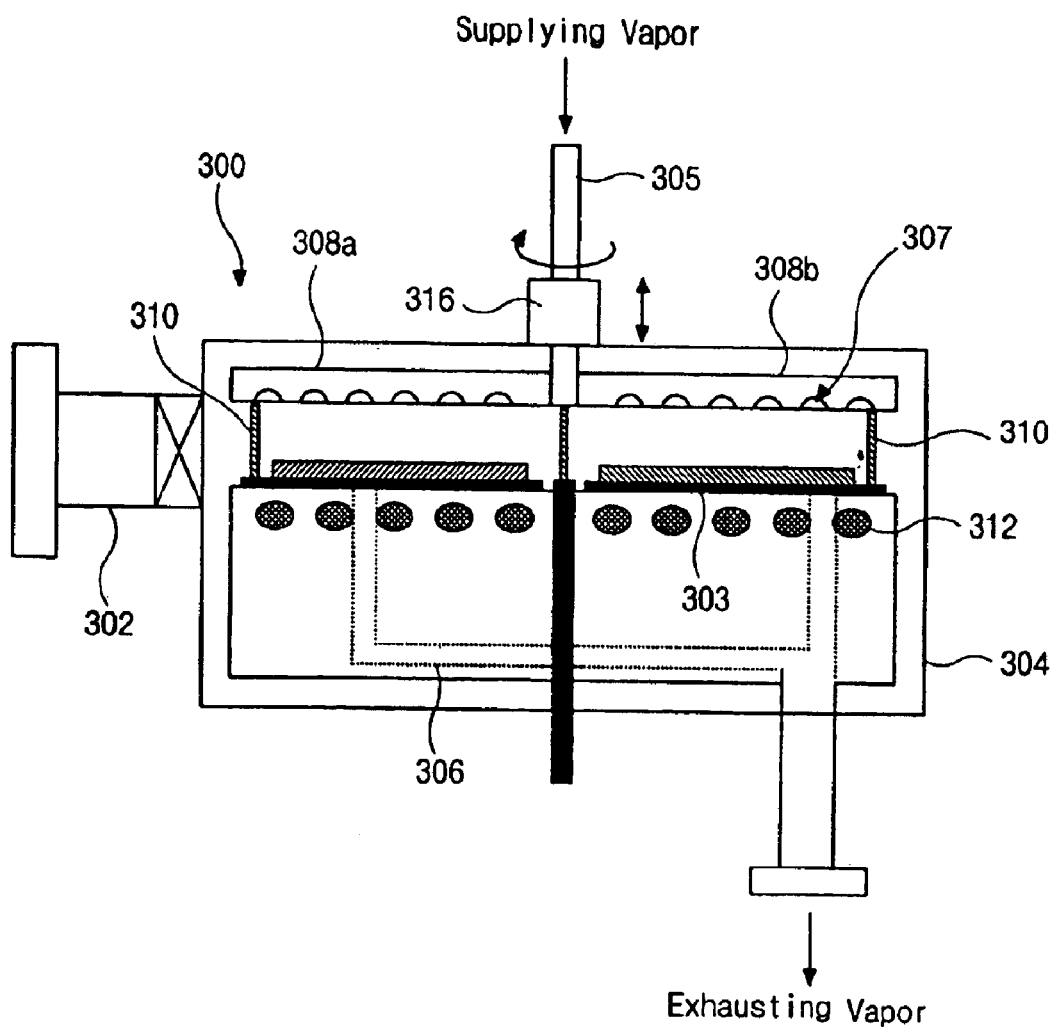
FIG. 3 is a sectional side elevation view illustrating a semiconductor device fabricating apparatus according to a preferred embodiment of the present invention.

In FIG. 3, a semiconductor device fabricating apparatus 300 according to the preferred embodiment of the present invention includes a reaction chamber 304. The reaction chamber 304 contains a plurality of susceptors 303 on which a plurality of substrates 314 are respectively mounted. That is to say, the plurality of substrates 314 are isolated from an exterior condition due to the reaction chamber 304.

A vapor supply pipe 305 penetrates into an upper portion of the reaction chamber 304 and communicates with a plurality of vapor injection pipes 308a to 308d (see FIG. 4), which are disposed over the substrates 314 in the reaction chamber 304. Each of the vapor injection pipes 308a to 308d has a plurality of open holes 307 toward the substrates 314. The vapor supply pipe 305 includes a plurality of concentric pipes (not shown) therein. Each concentric pipe has a different diameter depending on which vapor substance passes therethrough. The plurality of concentric pipes communicate with the plurality of vapor injection pipes 308a to 308d, respectively. Accordingly, the plurality of vapor injection pipes 308a to 308d respectively apply different vapor substances onto the substrates 314.

After the vapor substance is deposited on the substrate 314, the same vapor substance remaining in the reaction chamber 304 is exhausted through exhaust pipes 306. A plurality of ring-shaped heaters 312 are concentrically disposed under the susceptors 303 to heat the substrates 314 during the deposition.

The vapor supply pipe 305 can rotate with respect to a concentric axis of the plurality of concentric pipes (not shown) as well as can move in a longitudinal direction thereof. Height and rotation speed of the vapor supply pipe 305 are controlled by a position controller 316. Because the plurality of vapor injection pipes 308a to 308d communicated with the vapor supply pipe 305, they also rotate or move together with the vapor supply pipe 305. That is to say, the plurality of vapor injection pipes 308a to 308d timely inject the various vapor substances onto the substrates 314 as they are rotating over the substrates 314.

Figure 5:
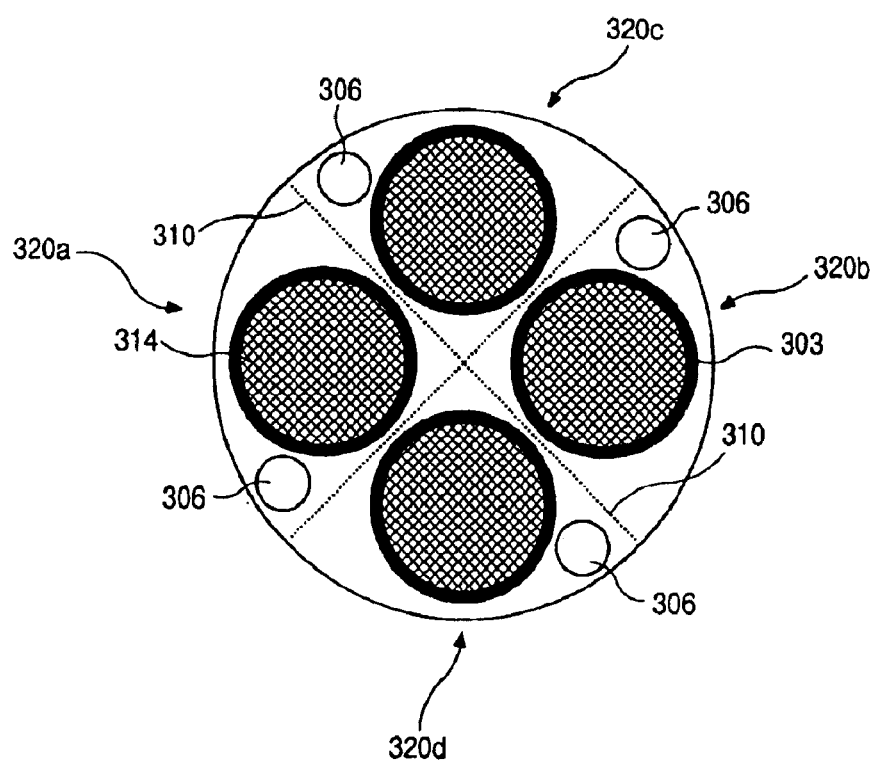
FIG. 5 is a vertical sectional view illustrating the semiconductor device fabricating apparatus shown in FIG. 3.

At this point, each susceptor 303, a corresponding substrate 314, and one of the vapor injection pipes 308a to 308d are arranged in a reaction cell (320a to 320d in FIG. 5) defined by a partition wall 310 (see FIG. 5). In other words, each of the reaction cells 320a to 320d in FIG. 5 defined by the partition wall 310 respectively contains one susceptors 303 and a corresponding substrate 314. The injection pipes 308a to 308d respectively injecting different vapor substances are sequentially and repeatedly positioned in each of the reaction cells (320a to 320d in FIG. 5). Accordingly, each different vapor substance is applied onto each substrate 314 with a pulse interval.

Figure 4:
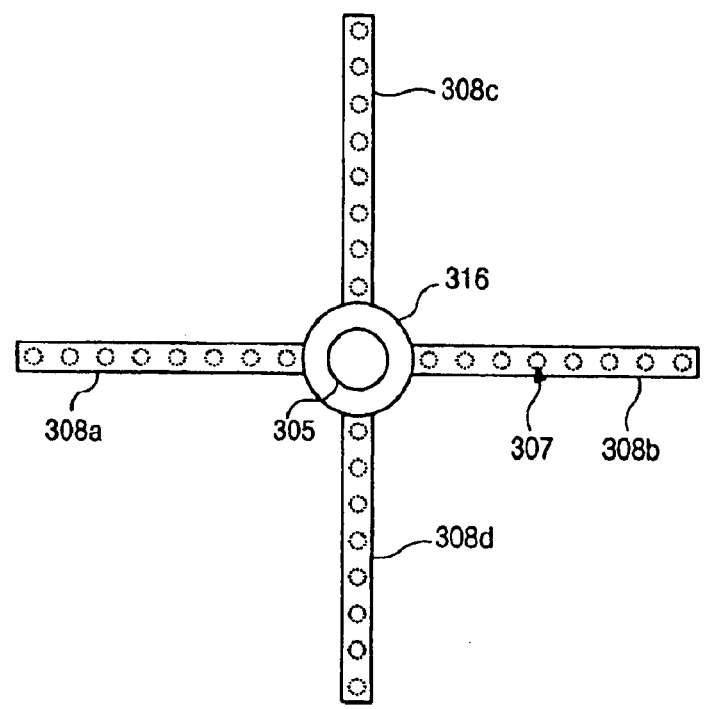
FIG. 4 is a plan view illustrating vapor supply portions of the apparatus shown in FIG. 3.

For example, first to fourth vapor injection pipes 308a to 308d in FIG. 4 are respectively injecting tri-methyl-aluminum [Al(CH$_3$)$_3$], purge argon (Ar), water vapor, and further purge argon (Ar). Then, the first to fourth vapor injection pipes 308a to 308d are rotating over the four substrates 314 (in FIG. 5) each mounted on the susceptor 303 (in FIG. 5), thereby forming an aluminum oxide film on each substrate 314. During one vapor injection pipe is scanning one substrate, the substrate and the injected vapor substance are surrounded by the partition walls 310 (in FIG. 5), thereby composing one reaction cell. Accordingly, each reaction cell (320a to 320d in FIG. 5) is almost chemically independent of the other.

The rotation speed of the vapor injection pipes 308a to 308d preferably has variable values that can be controlled by the position controller 316 in FIG. 4. Further, the vapor injection pipes 308a to 308d preferably approach the partition wall 310 with the nearest gap therebetween during the above-explained process, as shown in FIG. 3.

In the above-explained process, an interval between different periods of providing different vapor substances is inversely proportional to the rotation speed of the vapor injection pipes 308a to 308d. That is to say, if the rotating speed of the vapor injection pipes 308a to 308d are increased, time of one cycle composed of the different periods is shortened such that a total processing time is much shortened. In addition, because the flow of the vapor substance is not controlled by using valves, there exists no time delay resulting from a response time of the valves.

Returning to FIG. 3, when the deposition is finished, a substrate-loading portion 302 sequentially unloads the substrates 314 from the reaction chamber 300 and loads new substrates therein to mount them on the susceptors 303.

As explained above, the semiconductor device fabricating apparatus according to the preferred embodiment adopts the rotating vapor injection pipes to achieve a short processing time. Instead of rotating the vapor injection pipes, the susceptors may rotate but to provide similar effect. In case of rotating the susceptors with the vapor injection pipes fixed, RF power may be applied into the reaction chamber via the vapor injection pipes, thereby activating the vapor substances such that plasma is generated in the reaction chamber.

The semiconductor device fabricating apparatus and the method thereof according to the preferred embodiment enable a simultaneous ALD for a plurality of substrates, in spite of using a relatively smaller reaction chamber. In addition, because the vapor substances are injected from the rotating vapor injection pipes, the thin film can be more uniformly formed. Accordingly, productivity and quality are improved.

It will be apparent to those skilled in the art that various modifications and variation can be made in the method of manufacturing a thin film transistor of the present invention without departing from the spirit or scope of the invention. Thus, it is intended that the present invention cover the modifications and variations of this invention provided they come within the scope of the appended claims and their equivalents.

What is claimed is:

1. An atomic layer deposition method comprising:

respectively loading a plurality of substrates into a plurality of reaction cells, the plurality of reaction cells being disposed in a reaction chamber; and alternately and repeatedly applying various vapor substances onto each substrate such that a thin film is formed one ach substrate, wherein a plurality of vapor injection pipes each injecting one of the vapor substances periodically scans over each substrate to apply the various vapor substances alternatively and repeatedly onto each substrate.

2. The method of claim 1, wherein each substrate is heated using a heater disposed in the reaction chamber.

3. The method of claim 1, wherein RF power is applied to the vapor injection pipes such that plasma is generated in the reaction chamber.

4. The method of claim 1, wherein alternately and repeatedly applying vapor substances comprises:

relatively rotating each vapor injection pipe with respect to the plurality of substrates; and periodically applying one of the vapor substances onto each substrate.

5. The method of claim 4, further comprising controlling a relative rotation speed of each vapor injection pipe with respect to the plurality of substrates.

6. The method of claim 1, further comprising exhausting a remaining vapor substance out of the reaction chamber through a plurality of exhausting portion.

7. The method of claim 6, wherein the each exhausting portion is disposed on a surface of the chamber on which a corresponding susceptor resides, near the corresponding susceptor.

8. The method of claim 1, further comprising applying an RF power to the plurality of vapor injection pipes.

9. The method of claim 1, wherein each vapor substance applied onto the substrate reacts with the same substrate only by a partition wall separating each substrate from the others.

* * * * *